(12) United States Patent
Seko

(10) Patent No.: US 8,510,613 B2
(45) Date of Patent: Aug. 13, 2013

(54) CONTROL METHOD OF NON-VOLATILE SEMICONDUCTOR DEVICE

(75) Inventor: Akiyoshi Seko, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 168 days.

(21) Appl. No.: 12/929,939

(22) Filed: Feb. 25, 2011

(65) Prior Publication Data

US 2011/0214025 A1    Sep. 1, 2011

(30) Foreign Application Priority Data

Feb. 26, 2010  (JP) ................. 2010-043006

(51) Int. Cl.
*G11C 29/00* (2006.01)

(52) U.S. Cl.
USPC ............................ 714/720; 714/718; 714/735

(58) Field of Classification Search
USPC ............................ 714/720, 718, 719, 735, 738
See application file for complete search history.

(56) References Cited

U.S. PATENT DOCUMENTS

| | | | | |
|---|---|---|---|---|
| 4,398,269 A | * | 8/1983 | Hedin et al. .................. | 365/195 |
| 5,436,913 A | * | 7/1995 | Yamamura et al. ........... | 714/719 |
| 6,173,425 B1 | * | 1/2001 | Knaack et al. ................ | 714/718 |
| 7,154,788 B2 | | 12/2006 | Takemura et al. | |
| 7,257,034 B2 | | 8/2007 | Takemura et al. | |
| 7,545,683 B2 | | 6/2009 | Sumitani | |
| 7,613,038 B2 | | 11/2009 | Takemura et al. | |
| 7,813,178 B2 | | 10/2010 | Nakai | |

FOREIGN PATENT DOCUMENTS

| | | |
|---|---|---|
| JP | 2005-158199 | 6/2005 |
| JP | 2007-188552 | 7/2007 |
| JP | 2007-250171 | 9/2007 |
| JP | 2008-159178 | 7/2008 |

OTHER PUBLICATIONS

D. Ielmini et al, "Assessment of threshold switching dynamics in phase-change chalcogenide memories", Electron Devices Meeting, 2005. IEDM Technical Digest. IEEE International Volume, Issue 5-5 Dec. 2005 pp. 877-880.

* cited by examiner

*Primary Examiner* — Fritz Alphonse
(74) *Attorney, Agent, or Firm* — McGinn IP Law Group, PLLC

(57) ABSTRACT

A method includes temporarily storing write-data to be written into non-volatile memory cells, respectively, the memory cells being divided into cell groups, performing a first operation including write-phases performed in series and on an associated cell group and including applying a write-voltage to the memory cells belonging to the associated cell group in response to an associated write-data to be written into the memory cells belonging to the cell groups, and performing a second operation after the first operation is completed, which includes read-phases performed in series and on an associated cell group and including applying a first read-voltage to the memory cell or cells belonging to the associated one of the cell groups to produce first read-data therefrom, and comparing the first read-data with the write-data to be written into the memory cells belonging to the associated cell groups to produce comparison data.

12 Claims, 8 Drawing Sheets

FIG. 4    COMPARATIVE EXAMPLE 1

FIG. 5  COMPARATIVE EXAMPLE 2

CONTROL METHOD OF NON-VOLATILE SEMICONDUCTOR DEVICE

REFERENCE TO RELATED APPLICATION

This application is based upon and claims the benefit of the priority of Japanese patent application No. 2010-043006, filed on Feb. 26, 2010, the disclosure of which is incorporated herein in its entirety by reference thereto.

TECHNICAL FIELD

The present invention relates to a control method of a semiconductor device. More specifically, the invention relates to a semiconductor device including non-volatile memory elements such as phase change elements and a control method of the semiconductor device.

BACKGROUND

A phase change element (phase change element: abbreviated as "PCE") used in a cell of a phase change memory includes a phase change material such as chalcogenide ($Ge_2Sb_2Te_5$, for example), and a resistance value of the phase change element can be arbitrarily varied by controlling a current, a voltage, and a pulse shape of the voltage at a time of writing. In a binary memory element, in general, writing or a written state in which a cell assumes a high resistance is referred to as "reset", and data "0" is assigned to the state of "reset". On the contrary, writing or written state in which the cell assumes a low resistance is referred to as "set", and data "1" is assigned to the state of "set". When a PCE is heated to a temperature of a melting point or more and is then cooled at a comparatively fast speed, the PCE becomes amorphous (reset state) with a high resistance. When the PCE is held for a comparatively long period of time at a temperature not less than a crystallization temperature but not more than the melting point and is cooled at a comparatively slow speed, for example, the PCE has a crystallization state (set state) with a low resistance.

A resistance ratio between the set state and the reset state is large in the PCE. Thus, the PCE has an advantage that data is easier to read than other resistance-change type memories.

However, there is pointed out a problem of the PCE that a cell resistance value (transient resistance value) for several 10 ns from immediately after reset writing is excessively reduced as compared with a cell resistance value (steady-state resistance value) after a subsequent elapse of time (refer to Non-patent Document 1, for example). FIG. 5 of Non-patent Document 1 shows that a threshold VT has risen from about 0.5V to 0.7V in initial 30 ns after a reset pulse, and then saturates. FIG. 10 of Non-patent Document 1 shows extrapolation curves from immediately after reset writing to 100 ns or less, based on the result of measurement of a resistance R and VT-R correlation.

For this reason, when information (data) is read from a cell at a comparatively fast timing of several 10 ns after completion of writing of data into the cell in a verify operation, a transient resistance value which is extremely lower than a steady-state resistance value may be read, wherein in the verify operation, after data has been written into a cell, the data is read from the cell and pass/fail status is determined by comparing the readout data with write data.

Writing of data into a PCE is conducted by Joule heat generated by application of current. Thus, in a time range of several 10 ns immediately after the writing, a temperature of the PCE may not be sufficiently reduced to a range in which the data can be read. This may cause resistance values of the PCE immediately after the writing in both set and reset states to be unstable.

Patent Document 1 discloses a configuration including a read data latch which holds read data from a phase change memory cell and latches write data received from an outside, a write data latch which holds write data in a memory cell during a predetermined cycle until a start of writing, a transfer switch that controls presence or absence of transfer of an output of the read data latch to the write data latch, a comparison circuit which determines whether or not the data held in the write data latch matches the data in the read data latch, and a write flag latch which s h latches an output of the comparison circuit. Only when a write request is pending and a result of comparison of the comparison circuit indicates a mismatch, writing is performed. The writing is thereby performed only to a necessary bit. This configuration allows hiding of a comparatively long write time for a phase change memory to execute random writing to the phase change memory.

Patent Document 2 discloses a method of operating a phase change memory device including a step of programming a write data block including N number of unit program blocks in response to a request for a programming operation, a step of suspending the programming operation in response to a request for a read operation after M number of unit program blocks (M being smaller than N) have been programmed, a step of performing the requested read operation, and a step of resuming programming of the write data block and programming (N−M) number of remaining unit program blocks.

Patent Document 3 discloses a highly integrated and a high-speed non-volatile memory which stabilizes an operation of a phase change memory for a short operation cycle time. In this memory, a latch is provided in a write driver WD. A change to a high-resistance state of a phase change element is performed per column cycle by a write-enable signal, and a change to a low-resistance state of the phase change element is performed after a pre-charge command has been received and concurrently with deactivation of a pre-charge signal. With this arrangement, a write time to a memory cell in which phase change resistance is changed to a low-resistance state, and a period from a writing operation for changing the phase-change resistance, to a high-resistance state to a reading operation from the memory cell can be lengthened without extending the column cycle time, so that the stable writing operation is achieved.

Patent Document 4 discloses a semiconductor memory device including detection means for executing a writing process to memory cells in an address region, executing a block verification process for collectively performing verify operations of a plurality of addresses, repeating the block verification process and the writing process, and detecting whether or not a memory cell which has not been written yet is included in each address. In at least a part of the block verification process, at least a portion of addresses which has been determined not to include a memory cell that has not been written yet in a verification process executed one or more times before the block verification process is excluded. With this arrangement, the block verification process is executed. A period of time required for the block verification process can be thereby reduced and high-speed buffer writing can be performed. Patent Documents 1 to 4, however, never disclose recognition of the problems pointed out by Non-patent Document 1 and means for solving the problems.

Patent Document 1:

JP Patent Kokai Publication No. JP2008-159178A which corresponds to U.S. Pat. No. 7,813,178B2

Patent Document 2:
JP Patent Kokai Publication No. JP2007-250171A
Patent Document 3:
JP Patent Kokai Publication No. JP2005-158199A which corresponds to U.S. Pat. No. 7,154,788B2, U.S. Pat. No. 7,257,034B2 and U.S. Pat. No. 7,613,038B2
Patent Document 4:
JP Patent Kokai Publication No. JP2007-188552A which corresponds to U.S. Pat. No. 7,545,683B2
Non-patent Document 1:
D. Ielmini, A. L. Lacaita, D. Mantegazza, F. Pellizzer, and A. Pirovano "Assessment of threshold switching dynamics in phase-change chalcogenide memories", Electron Devices Meeting, 2005. IEDM Technical Digest. IEEE International Volume, Issue, 5-5 December 2005 Page(s): 877-880

SUMMARY

The following analysis is given by the inventor of the present invention.

As described before, it is pointed out that, in the phase change memory which uses a cell resistance value difference for data storage, a cell resistance value immediately after writing which causes a cell to assume a high resistance is extremely reduced as compared with a resistance value after a certain period of time has been elapsed from the writing. For this reason, it is desirable to read cell data in the phase change memory after the certain period of time has elapsed from completion of the writing.

However, when the cell data is read after the elapse of the certain period of time from the completion of the writing, it is difficult to achieve reduction of a total period of time for cell data writing and verify operation including cell data reading and verification (this problem will be described in detail later as a comparative example).

According to the present invention which seeks to solve at least one of the problems, there is provided a method which will be schematically described as follows, though not limited thereto. According to one aspect of the present invention, there is provided a control method of a non-volatile semiconductor device that includes cells, to each of the cells a stress for rewriting information being applied and each cell having a first time period as a period of time until a characteristic of the cell is stabilized to expectation value information after the stress for rewriting information is applied, wherein the method comprises:

a plurality of first sequences, in each of the first sequences, writing to a plurality of the cells continuously in time series being performed; and a plurality of second sequences, in each of the second sequences, verify operation of the plurality of the cells continuously in time series being performed after the continuous writing, wherein when a plurality of sets each comprising the first sequence and the second sequence are repeated continuously in time series, a period of time arranged from completion of the stress application for each of the plurality of the cells in the first sequence to start of the second sequence for each of the plurality of the cells to which the stress application is performed is set to the first time period or more in all of the sets.

According to the present invention, even in a cell having a first time period as a period of time until a characteristic of the cell is stabilized to expected information (data) after applying a stress, accuracy of verify operation can be improved, a total period of time for a write sequence can be shortened, and a period of time required for the verification operation can be shortened. Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED MODES

Figure 1:
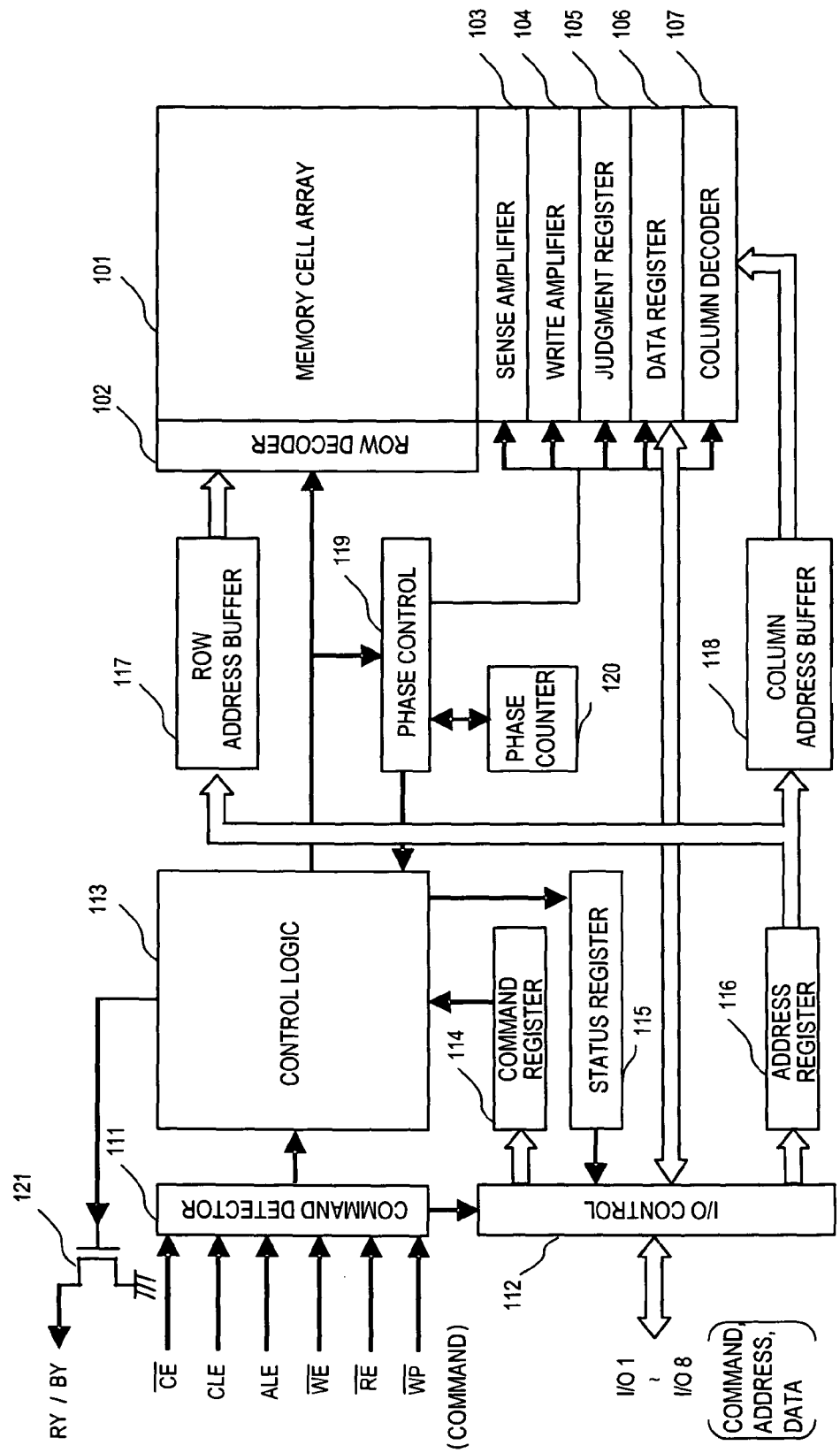
FIG. 1 is a diagram showing a configuration of a semiconductor memory device of the present invention.

A typical example of one of technical concepts according to the present invention solving at least one of the above mentioned problems will be described. It goes without saying that claiming contents of the present application are not limited to the technical concepts, but may include contents described in the claims of this application.

According to the present invention, there is provided a control method of a non-volatile semiconductor, wherein the non-volatile semiconductor device includes a plurality of cells (100-1 in FIG. 2), each of which needs verification in which, after writing write data into a cell, the cell data is read and compared with an expectation value (original write data). In each of the cells, transition of the information to the expectation value is completed in a first time period after a stress due to the rewriting has been applied. The method includes a sequence control, in which sequential rewriting of a plurality of the cells is performed in time series, and then verification using comparison with a plurality of expectation values respectively corresponding to the rewritten cells is made in the order of the rewritten cells. A period of time from the stress application to the verification is thereby set to be longer than the first time period for each of the plurality of the cells.

According to one of modes of the present invention, the control method includes a plurality of first sequences (write sequences), in each of which writing to the cells is performed continuously in time series; and a plurality of second sequences (read sequences), in each of which said second sequences, verification of the cells is performed continuously in time series, after the writing performed continuous in time series. In the control methods according to one of modes of the present invention, in repeating, continuously in time series, a plurality of sets (verify operations), each of which comprises a plurality of the first sequences (write sequences) and a plurality of said second sequences (read sequences), a period of time from completion of application of the stress to each of the cells in the first sequence (write sequence) until start of the verification in the second sequence (read sequence) for the each of the cells subjected to the stress application, is set to be the first time period or more. A preferred exemplary embodiment of the present invention will be described in detail with reference to appended drawings.

In the semiconductor device including a non-volatile memory according to the present invention, at a time of a series of data writing operations from receipt of a command, data writing to a memory cell and verify reading from memory cells performed a plurality of times by time division (using phases obtained by division of data). In this semiconductor device, write and read sequences are elaborated. A constant period of time (longer than the first time period) from completion of writing to verify reading is ensured for each of the cells, without producing a no-operation period as much as possible.

When a plurality of items of data that are as long as several Kbytes (kilobytes in which 1K=1024 bits, and 1 byte=eight bits) is written into a corresponding cells (the number of which are several multiples of 1024×8) in a series of writing operations, for example, the data may be divided into a plurality of phases (units of time division) indicating data writing to the cells at a plurality of times on a time division basis. That is, in one phase, the data is simultaneously written into a plurality of the cells. the number of which corresponds to the number of bits associated with the phase. With this arrangement, the number of bits to which simultaneous writing is performed can be reduced, and current consumption at a time can be lessened.

Each of the following exemplary embodiments shows a device configuration, an array configuration, and details of the above-mentioned operation to which the present invention is applied.

FIG. 1 is a diagram showing a configuration example of a semiconductor device in one exemplary embodiment of the present invention. Referring to FIG. 1, this semiconductor device includes as an input circuit a command detector 111 to which a command (by chip enable /CE, command latch enable CLE, address latch enable ALE, write enable /WE, read enable /RE, write protect /WP signals) are supplied.

The command latch enable CLE signal is a signal which is used to control capturing of a command by a command register 114 inside the device. When the command latch enable CLE signal is set High at a rise and a fall of the write enable /WE signal, data at I/O terminals (ports) is captured by a command register 114 as a command.

The address latch enable ALE signal is a signal which is used to control capturing of an address signal and a data signal by an address register 116 and by a data register 106 inside the device, respectively. When the address latch enable ALE signal is High at the rise and the fall of the write enable /WE signal, data at the I/O ports is captured by the address register 116 as address data. When the address latch enable ALE signal is Low at the rise and the fall of the write enable /WE signal, data at the I/O ports is captured by the data register 106 as input data.

The chip enable signal /CE is a device selection signal. When the chip enable signal /CE is High in a read state, for example, the semiconductor device is brought into a standby mode. The write enable signal /WE is a write control signal for capturing data from the I/O ports. The read enable signal /RE is a signal for outputting (serially outputting) data read from a memory cell array. Ports I/O 1 to I/O8 are ports for receiving/outputting an address, a command, or data. The write protect signal /WP a control signal for forbidding writing and erasing operation to protect data. The write protect signal /WP is normally set High. At power-on or power-off, the write protect signal /WP is set Low. A signal RY/BY is a signal for notifying an internal state of the device to an outside and is output from a drain of an nMOS transistor 121 having an open-drain configuration. While an operation such as a programming operation, an erasing operation, or a read operation is executed, a gate of the nMOS transistor 121 is set to a High level and the MOS transistor 121 is turned on (conductive) to set the signal RY/BY Low (Busy). When the operation is completed, the gate of the nMOS transistor is set to a Low level. The signal RY/BY is pulled up to a power supply voltage and set to High (Ready).

The semiconductor device includes as an input/output circuit an I/O control circuit 112 to and from which a command, an address, and data (at the I/O ports I/O1 to O/O8) are supplied and output.

The command register 114 supplies command information output from the I/O control circuit 112 to a control logic 113.

The address register 116 supplies address information output from the I/O control circuit 112 to a row address buffer 117 and a column address buffer 118. The semiconductor device in FIG. 1 has no address port. Accordingly, an address signal (with a bits width more than eight bits) is supplied in a time-divided manner in a plurality of cycles, with eight bits for each cycle.

The control logic 113 receives an output from the command detector 111 and the command register 114, and generates and supplies predetermined control signals to respective circuits arranged in the vicinity of a memory cell array. The row address buffer 117 outputs a row address output from the address register 116 to a row decoder 102. The row decoder 102 selects a word line (not shown) within a memory cell array 101 corresponding to the row address. The column address buffer 118 outputs column start address outputted from the I/O control circuit 112 to a column decoder 107.

The semiconductor device shown in FIG. 1 includes data registers 106 (having a capacity of several kilo-bytes, for example). the number of which is equal to the number of all column addresses. A column address associated with the memory cell array 101 is assigned to each data register 106. Assume that address zero (origin) is selected as a column start address, for example, and data (in units of bytes), the number of which corresponds to the number of all column addresses are serially received in one writing operation. Then, the data sequentially corresponding to addresses of the data registers 106 are written into the corresponding addresses of the data registers 106, starting from the column address zero in the order of data input.

The data held in the data registers 106 is written into the memory cell array 101. This writing is triggered by reception of the command (write command) supplied to the I/O control circuit 112 through the I/O ports I/O1 to I/O8 under control of the control logic 113.

On the other hand, when an address other than the origin is supplied as the column start address, data is sequentially written to addresses of the data registers 106 starting from the column start address, in the order of data input. In this case, when data corresponding to a column end address is not supplied to the I/O control circuit 112, writing is performed to the column address to which the data of the last byte has been supplied. Then, the data held in the data registers 106 is written to the memory cell array under control of the control logic 113, being triggered by supply of the command to the control 112 through the I/O ports I/O1 to I/O8.

The data written into the data register 106 is output to a corresponding bit line of the column address of the memory cell array 101 through a write amplifier 104. The data is written into a cell at an intersection between a selected bit line and a selected word line. The PCE of each cell is written to a reset state with a high resistance or to a set state with a low resistance, according to a value (0/1) of the write data.

When writing data of several kilo-bytes, data writing is performed a plurality of times by time division. That is, the data is divided into a plurality of phases to be written. When the time division is performed, a column address is divided into a plurality of addresses. Writing into the memory cell array 101 is performed for each divided address. With this arrangement, the number of cells to which the data writing is simultaneously performed can be reduced.

Assume, for example, that, in the writing performed a plurality of times by time division, a group of the data written first is set to a phase 1. Then, a group of the data written next is set to a phase 2, a group of the data written next is set to a phase 3. States of the time division are sequentially assigned. Control over this time division is performed by a phase control 119. A phase counter 120 is a counter for controlling an access target phase, and performs sequential counting up from the value of the phase 1. Assuming that the column address is N, the number of cells (the number of selected columns) simultaneously written in one phase is M, and the number of phases is to K, the following relationship holds:

$$N = M \times K$$

Accordingly, the value of the phase counter 120 corresponds to higher-order bits of the column address, while the number of cells simultaneously written in one phase corresponds to remaining lower-order bits of the column address.

At a time of data reading from the memory cell array 101 as well, time division control is performed as in the data writing.

The time division control is performed by controlling each circuit such as a sense amplifier 103 and the column decoder 107 by the phase control circuit 119.

When an operation of reading cell data is performed, information read by time division is sequentially saved in the data registers 106. Then, after read data has been all saved in the data registers 106, the read data is output to the IO ports IO/1 to IO/8 through the I/O control circuit 112 under the control of the control logic 113, using the output command received from the I/O control circuit 112, as a trigger.

Status information on a pass/fail of data writing is set in a status register 115 through the control logic 113. This status information is output to the I/O ports I/O1 to I/O8 from the I/O control circuit 112, when the writing operation is completed.

The signal RY/BY assumes a low impedance (the nMOS transistor 121 is conductive) during time periods of data writing into the memory cell array 101 and data reading from the memory array 101. A command input during these time periods becomes invalid. After the operation has been completed, the nMOS transistor 121 having the open-drain configuration is turned non-conductive. The signal RY/BY is pulled up to a High potential by a load circuit or the like which connected externally to the semiconductor device.

Referring to FIG. 1, the semiconductor device in this exemplary embodiment includes a judgment register 105. The judgment register 105 can hold data, the number of which is the same as the number of column addresses. Address allocation associated with the column addresses in the memory cell array 101 is performed. The judgment register 105 holds pass/fail information of respective cells, the number of which corresponds to the number of the column addresses.

Figure 2:
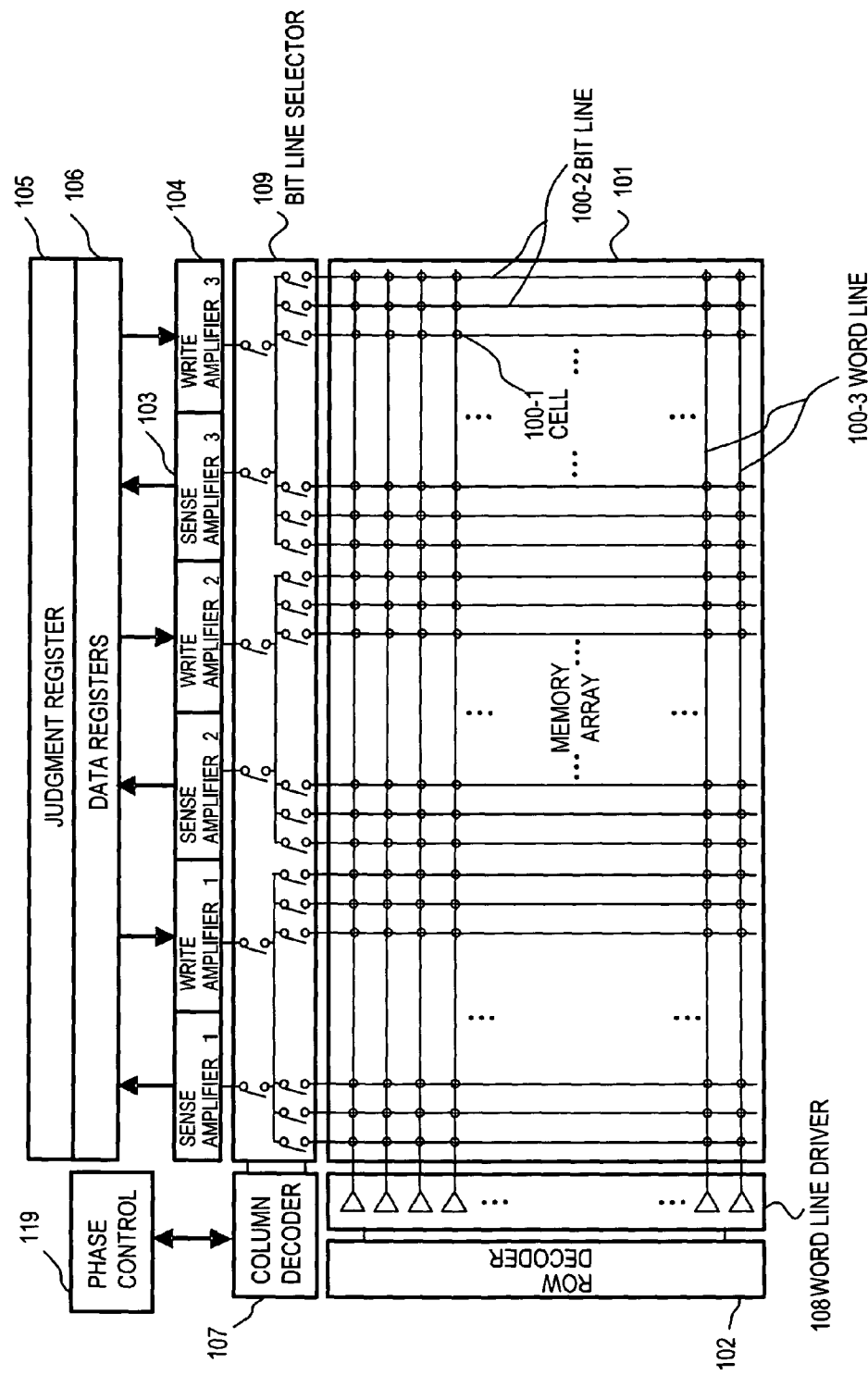
FIG. 2 is a diagram showing a configuration of a memory array in FIG. 1.

FIG. 2 is a diagram showing an example of configurations of the memory cell array (memory array) and circuits in the vicinity of the memory cell array in this exemplary embodiment shown in FIG. 1. As shown in FIG. 2, there are provided the memory cell array 101, a word line driver 108 for driving a selected word line 100-3 in the memory cell array 101, a row decoder 102, a bit line selector 109 for selecting a bit line 100-2 in the memory cell array 101, sense amplifiers 103, and write amplifiers 104. A cell 100-1 including the PCE (not shown) is provided at an intersection between each bit line 100-2 and each word line 100-3. With respect to an internal configuration of the cell 100-1, Patent Documents 2 and 3 are referred to, for example. The cell 100-1 of an MOS type includes an nMOS transistor having a gate electrode connected to the word line; and a PCE connected between the bit line and a drain electrode of the nMOS transistor as a phase change resistance.

Each of the write amplifiers 104 and the sense amplifiers 103 transfers data to and from the data register 106 and the judgment register 105. With respect to generation of a write pulse, using the write amplifier 104 at a time of data writing, descriptions of Patent Documents 1 through 3 are referred to.

The row decoder 102 decodes an X address to select a word line 100-3 and the word line driver 108 activates the selected word line 100-3.

The column decoder 107 controlled by the phase control 119, selects a bit line 100-2 corresponding to a column address for each phase group.

In the configuration in FIG. 2, the cells 100-1 of three bits constitute one phase, and simultaneous writing and simultaneous reading are respectively performed for each three bits.

The phase is changed by switching a plurality of the bit lines 100-2 connected to the sense amplifiers 103/write amplifiers 104 by the bit line selector 109 which receives information (on a selected column) from the column decoder 107 through control from the phase control circuit 119. The phase control circuit 119 which receives a count value (corresponding to a phase number) from the phase counter 120 in FIG. 1 supplies the column address corresponding to the selected phase to the column decoder 107. Then, the phase control circuit 119 controls the bit line selector 109 so that the column decoder 107 selects the bit lines of the column corresponding to the selected phase.

In this exemplary embodiment, the number of the cells to which simultaneous writing is performed basically equal to the number of the write amplifiers 104, and the number of the cells from which simultaneous reading is performed is basically equal to the number of the sense amplifiers 103. In the example in FIG. 2, there are three sense amplifiers 103 and three write amplifiers 104. Then, the number of the cells to which simultaneous writing is performed is three, and the number of the cells from which simultaneous reading is performed is three. When the number of the cells to or from which simultaneous reading or simultaneous writing is performed is three, the total number of bit lines N and the number of phases K (from first to K phases) satisfies a relationship of 3×K=N.

While FIG. 2 shows an example of simultaneous writing of three cells for simplification, data input/output is performed for each byte in the configuration of the device in FIG. 1. Accordingly, actually, simultaneous writing of at least eight cells is performed. The number of the phases and the number of simultaneous writing can be arbitrarily set.

Figure 3:
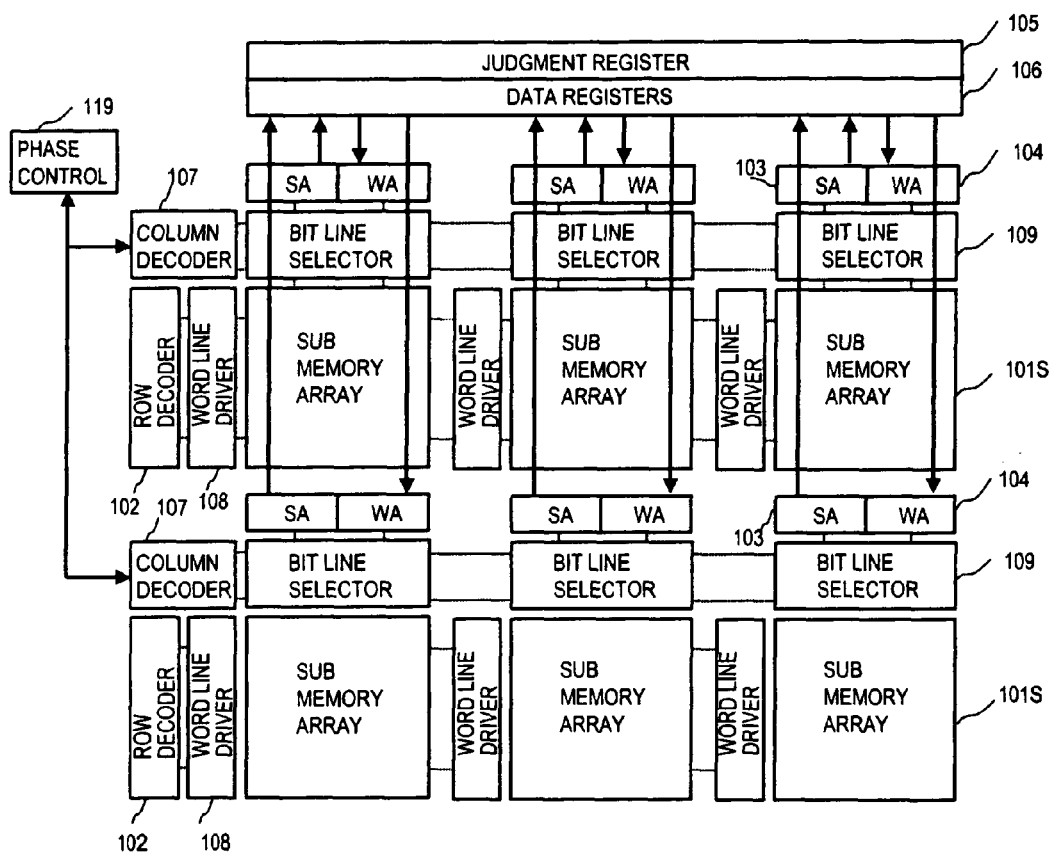
FIG. 3 is a diagram showing a configuration of the memory array in FIG. 1.

In this exemplary embodiment, the memory cell array 101 in FIG. 2 may be segmentalized into a plurality of sub memory arrays 101S, as shown in FIG. 3. Though no particular limitation is imposed, the memory cell array 101 in FIG. 2 is divided into 2×3=6 sub arrays 101S in the example shown in FIG. 3. The row decoder 102, the word line driver 108, the column decoder 107, the bit line selector 109, the sense amplifiers 103, and the write amplifiers 104 are provided, corresponding to each sub array. The data registers 106 and the judgment register 105 are connected to two sense amplifiers 103 and two write amplifiers 104 of each sub array column.

In the configuration in FIG. 3, simultaneous writing and simultaneous reading can be performed for each sub array. The number of simultaneous writing and the number of simultaneous reading for each phase are six (=equal to the number of the sub arrays=the number of the sense amplifiers=the number of the write amplifiers). That is, one cell from each of the three sub arrays in an upper stage and one cell from each of the three sub arrays in a lower stage are simultaneously selected. The configuration in FIG. 3 includes the data registers 106, the number of which is the same as a sum of the number of all column addresses for the three sub arrays in the upper stage and the number of all column addresses for the three sub arrays in the lower stage. The judgment register 105 also holds cell information (on pass/fail), the number of which is the same as the sum of the number of all column addresses for the three sub arrays in the upper stage and the number of all column addresses for the three sub arrays in the lower stage.

In this exemplary embodiment, the number of the cells to which simultaneous writing operations are performed is equal to the number of the write amplifiers 104, and the number of the cells from which simultaneous reading operations are performed is equal to the number of the sense amplifiers 103. The numbers of these amplifiers do not always need to be equal. The number of the sense amplifiers 103 should be equal to or larger than the number of the cells to which the simultaneous reading operations are performed. The number of the write amplifiers 104 should be equal to or larger than the number of the cells from which the simultaneous writing operations are performed. For example, as a case of the numbers of these amplifiers which is larger than the number of the cells, this corresponds to a case where a ROW address is assigned for control over a part of switches in bit line selectors, though not shown.

When data writing is performed by time division (for each phase) in a phase change memory, writing and reading repeated for each phase in a verify operation. For this reason, a period of time from completion of the data writing to start of the data reading is extremely short. Thus, a resistance value different from a resistance value in a steady-state may be read, as described above.

First, comparative examples will be described below with reference to FIGS. 4 and 5. Both of the comparative examples are different from the present invention.

First Comparative Example

Figure 4:
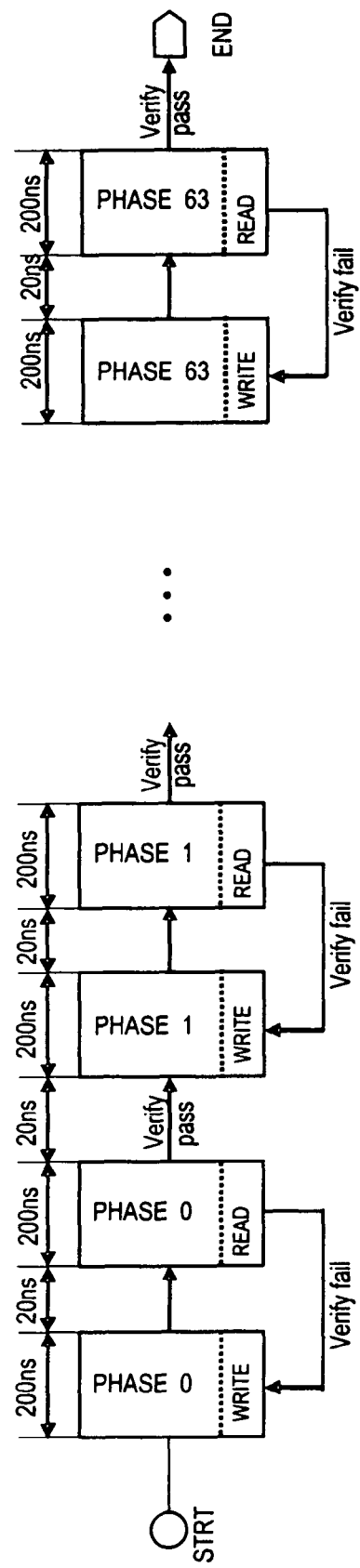
FIG. 4 is an association diagram explaining a write sequence of a phase change memory in a first comparative example.

FIG. 4 shows a verify operation sequence performed for each phase, wherein a time taken for writing to one cell is set to 200 ns, a switching time taken from completion of writing to start of reading is set to 20 ns, a time taken for the reading is set to 200 ns, a phase switching time is set to 20 ns, and the number of phase division is set to 64. The switching time taken from the writing to the reading includes a time associated with the control logic 113 and a plurality of the circuits controlled by the control logic 113. The phase switching time includes a time associated with the phase control circuit 119 and a plurality of the circuits controlled by the phase control circuit 119. The time taken for the reading includes a judgment time by the judgment register 105.

"PHASE" in FIG. 4 indicates a data unit when each of a simultaneous reading operation and a simultaneous writing operation is performed. An arrow indicating "verify fail" in FIG. 4 from a phase that has been read to the phase that has been written shows that all or partial data from cells read by a phase read sequence is different from write data (expectation value) to the cells, that the cells are therefore fail (verify fail) cells, and that rewriting is to be performed.

In the case of FIG. 4, the time taken from completion of writing to completion of reading in the same phase is 20 ns, which is short. Cell resistances are in a transient state at a start of reading. Thus, a stable verify operation may not be able to be performed.

Second Comparative Example

Figure 5:
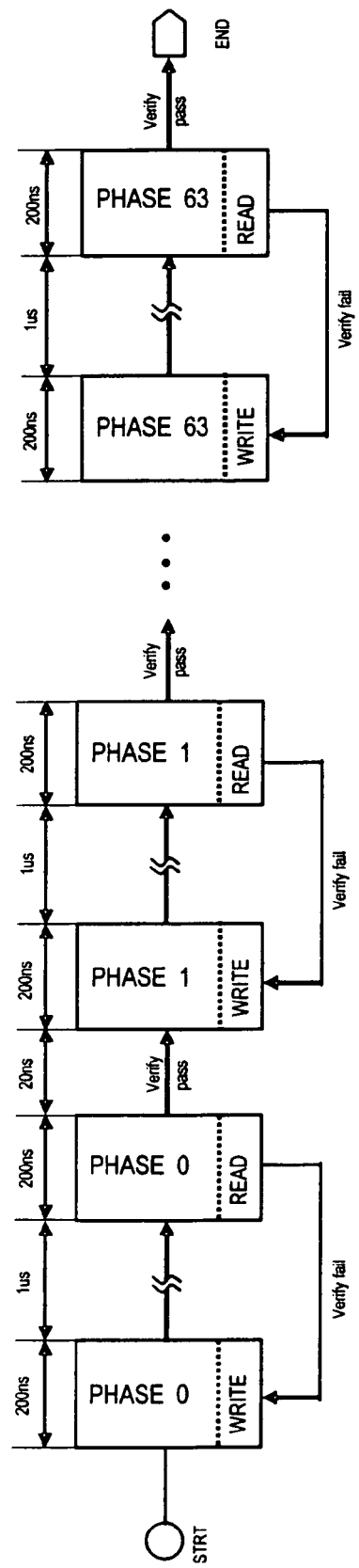
FIG. 5 is a diagram explaining a write sequence of a second comparative example, in which an interval is provided before verify reading.

In the case of a second comparative example in FIG. 5, the above-mentioned problem of the first comparative example is avoided by increasing a switching time from completion of writing to start of reading (by 1 μs (micro second), for example). That is, a time taken for the writing to one cell is set to 200 ns, the switching time taken from the writing to the reading is set to 1 μs, a time taken for the reading is set to 200 ns, a phase switching time is set to 20 ns, and the number of phase division is set to 64.

In the second comparative example, however, the switching time from the writing to the reading is increased, corresponding to a time taken for cell resistances to reach steady-state resistance values from transient resistance values in a transient state. Accordingly, a stable verify operation can be performed. However, there is a problem that write throughput is greatly reduced.

The verify operation is performed, for example, by comparing write data supplied to the write amplifier 104 with read data output from the sense amplifier 103 by the judgment register 105 in FIG. 1. When a fail is detected, rewriting to the cell from which the fail is detected is performed. A loop of re-writing and reading is repeated until all cells in a phase pass the verify operation.

Write data is transferred to the write amplifiers 104 from the data registers 106 for each phase.

With respect to a cell which has passed a verification in one phase (such as phase 0), a routine is repeated on the cell due to a verify-failed cell in the same phase. In the repeated routine, writing to and reading from the cell which has passed the verification in the same phase is masked. In the masking, control is performed such that the write amplifier 104 is deactivated and stress application for writing to a corresponding cell is not performed (reset current or set current is not flown).

The following arrangement is made, depending on a system. That is, assume that, even if verifications were made a predetermined number of times in a same phase, all the cells in the same phase have not passed the verifications. Then, status information indicating a failure of writing, held in the status register 115 is output to an outside from the I/O ports I/O1 to I/O8 (refer to FIG. 1) through the control logic 113 and the status register 115, using a predetermined externally supplied command as a trigger (refer to FIG. 1).

First Example

Figure 6:
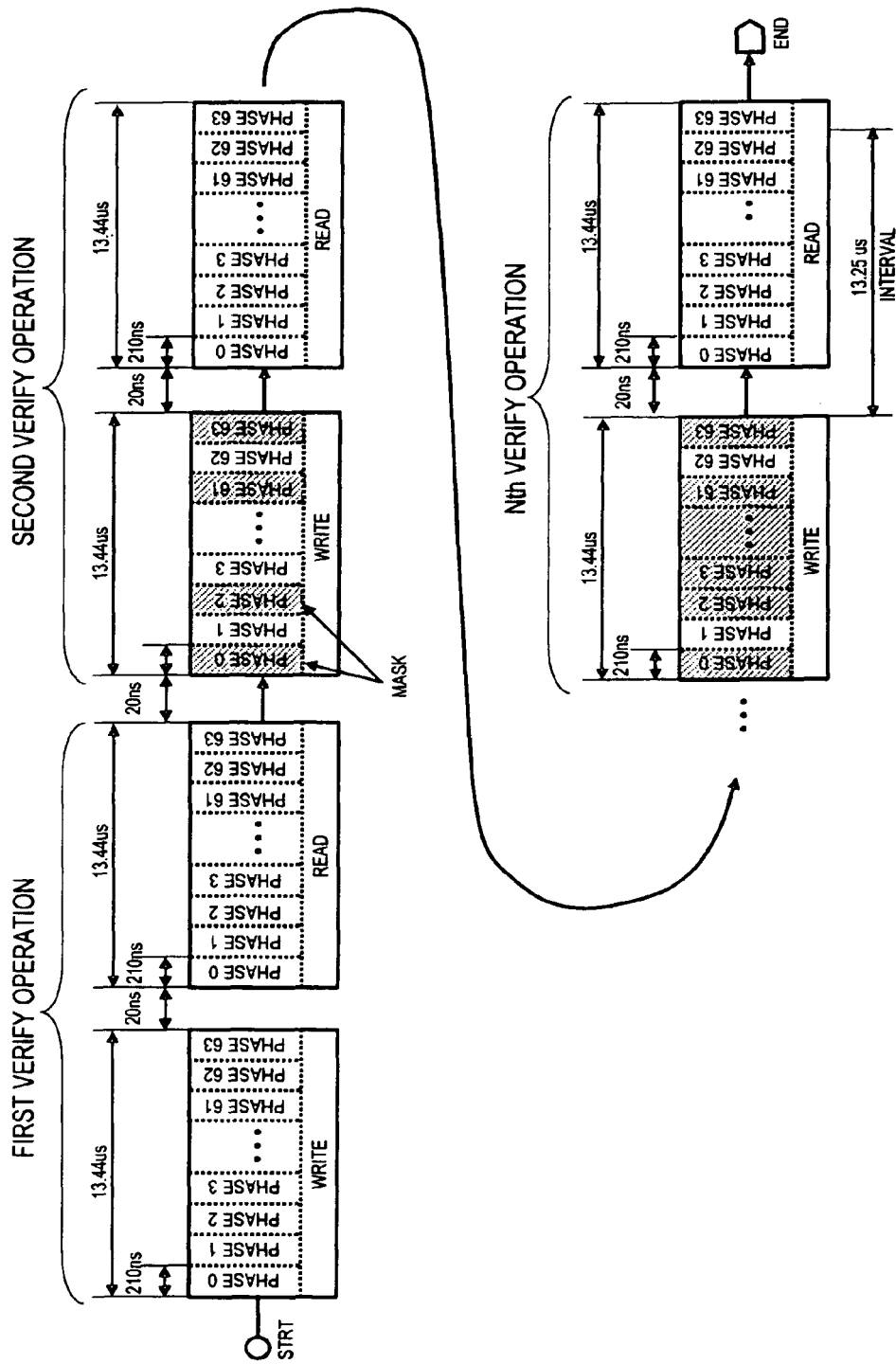
FIG. 6 is a diagram explaining a write sequence in a first exemplary embodiment of the present invention.

FIG. 6 is a diagram explaining an operation in a first example of the present invention described with reference to FIGS. 1 to 3. This example accommodates a time taken for cell resistance to reach a steady-state resistance value from a transient resistance value in a transient state. Further, an interval from completion of writing to verify reading is ensured without causing a great reduction of write throughput. FIG. 6 schematically shows a write sequence including verify operations in this example. The following setting is made with reference to FIG. 6, though no limited thereto:

write time=210 ns/phase (including a phase switching time)

read time=210 ns/phase (including the phase switching time)

the number of phases=64 switching time between writing and reading=20 ns

It takes 210 ns×64=13.44 μs to perform writing and reading from phases 0 to 63, irrespective of presence or absence of masking.

As a verify operation (first verify operation) in this example, data writing is performed to a plurality of cells in each phase in the order (ascending order) of phases 0 to 63.

Then, data reading (verify reading) is performed from the plurality of cells in each phase in the order (ascending order) of phases 0 to 63.

Data writing may be performed in the order of phases 63 to 0, and then data reading may be performed in the order (descending order) of phases 63 to 0.

Pass/fail information on each cell in each phase obtained in a verify-read sequence is held in the judgment register 105.

In a subsequent verify operation (second verify operation), the data in the judgment register 105 is read and supplied to the write amplifiers 104. Then, rewriting is performed only to the phase in which a fail cell is present, using write data read from the data register. All writing is masked for phases (in which no fail cell is present and which have passed the verify operation) other than the phase in which the fail cell is present.

Even in the phase as well in which the fail cell is present, writing to the cell in the phase which has passed the verify operation is masked (no writing is performed).

Determination as to whether or not to rewrite the phase is made, for example, by obtaining information on a logical sum of entire information (pass/fail information) on cells belonging to the phase by the judgment register 105. In the case of a configuration in which data on eight cells in one phase are simultaneously read and a pass/fail determination result about each cell is saved in the judgment register 105, the logical sum of cell information on these eight cells assumes 0 when all the eight cells pass the verify operation (fail information=0). When one of the eight cells fails (fail information on the fail cell is 1) in the verify operation, the logical sum of cell information on the eight cells assumes 1. Thus, it can be seen that the phase is a fail phase, or a phase for which rewriting is necessary.

In this case, the write time for the phase to which no writing will be performed (in which cells belonging to the phase have all passed the verify operation and rewriting will be masked) is not eliminated (without skipping a routine), and waiting is performed for only a time supposed to be necessary for the writing. 210 ns is assigned to each of phases 0, 2, ... 61 and 63 as well to which writing will be masked in a time division write sequence for each phase in the second verify operation in FIG. 6. Thus, waiting for 210 ns is performed for each phase. This operation is performed because of the following reason. Assume that there is only one phase (phase 0 alone) for rewriting, and that the time taken for a writing operation to each of phases 1 to 63 is skipped to transition to reading from phase 0. Then, the time taken for a cell resistance to reach the steady-state resistance value from the transient resistance value in the transient state cannot be ensured, as in the first comparative example.

Data reading (verify reading) from the cells in verify operations after the second verify operation is performed on all the phases, irrespective of presence or absence of masking. In this case, the cells and the phases which have passed an immediately preceding one of the verify operations are read again. Thus, cell resistance values are checked again. Then, extraction of an unstable bit is thereby facilitated. However, it is not always necessary to check the resistance values again. Reading from cells and phases which have passed the verify operation may be masked in order to reduce power consumption at a time of reading. In this case, an associated determination circuit is controlled to be inhibited or an output of the determination circuit is controlled to be passed through, irrespective of input data. Waiting is performed for the phase from which reading has been masked, without eliminating the read time. In the first example, 210 ns is assigned to the phase from which reading has been masked as well, and waiting of the time of 210 ns is performed for the phase. This operation is performed because, if there is only one phase (phase 63 alone) for rewriting, and if the time taken for the reading operation from each of phases 0 to 62 is skipped to transition to reading from phase 0, the time taken for cell resistances to reach the static-stage resistance values from the transient resistance values in the transient state cannot be ensured, as in the first comparative example.

Write masking control and read masking control are performed by transferring information in the judgment register 105 to the write amplifier 104 and the sense amplifier 103. It may be so arranged that the write amplifier 104 in which write masking is set is not activated, so that the write amplifier 104 does not output a write pulse, and that the sense amplifier 104 in which read masking is set is not activated, so that the sense amplifier 104 does not output read data. In this case, the judgment register 105 sets an output of the judgment register 105 corresponding to the deactivated sense amplifier to pass, irrespective of an actual result of comparison by the judgment register 105. Further, the corresponding comparison may be deactivated (masked).

By using the sequence in the first example, the time interval of 13.25 μs can be constantly provided from completion of writing to start of reading of the same cell in the example of FIG. 6, for example. In the first verify operation in FIG. 6, the time interval of (13.44 μs−210 ns)+20 ns=13.25 μs is provided between a cell writing completion time and a cell reading start time of phase 0, for example. Similarly, the time interval of (13.44 μs−210 ns×2)+20 ns+210 ns=13.25 μs is provided between a cell writing completion time and a cell reading start time of phase 1 as well. The same holds true for the other phases 2 to 63 in the first verify operation and the other verify operations.

This operation is repeated until all the phases pass the verify operation.

When the verify operation is performed N times (prescribed times), and all the cells in the same phase do not pass, status information indicating a failure of writing is output to the outside through the I/O ports I/O1 to I/O8, using input of the command through the control logic 113 and the status register 115, as a trigger.

As an application (though not shown), the above defined operation on each phase may be further time-divided to be performed at a time of writing alone in order to reduce current at the time of writing. When each phase at the time of writing is divided into two (when the number of the simultaneous written cells in each phase is halved and writing operations are performed twice), for example, a write sequence period doubles, but peak current at the time of writing is halved. Further, the number of the write amplifiers can be halved by refining a bit line control circuit. Similarly, only the operation on each phase in a read sequence may be further time-divided.

Second Example

Next, a second example will be described. In the first example, waiting is performed, at a time of writing in each verify operation after the second verify operation, without eliminating a wait time for a phase that has passed a preceding verify operation. Accordingly, each phase always needs a writing period of time. On contrast therewith, the second example discloses a method of achieving further time reduction while ensuring a time taken for a cell resistance to reach a steady-state resistance value from a transient resistance value in a transient state.

Figure 7:
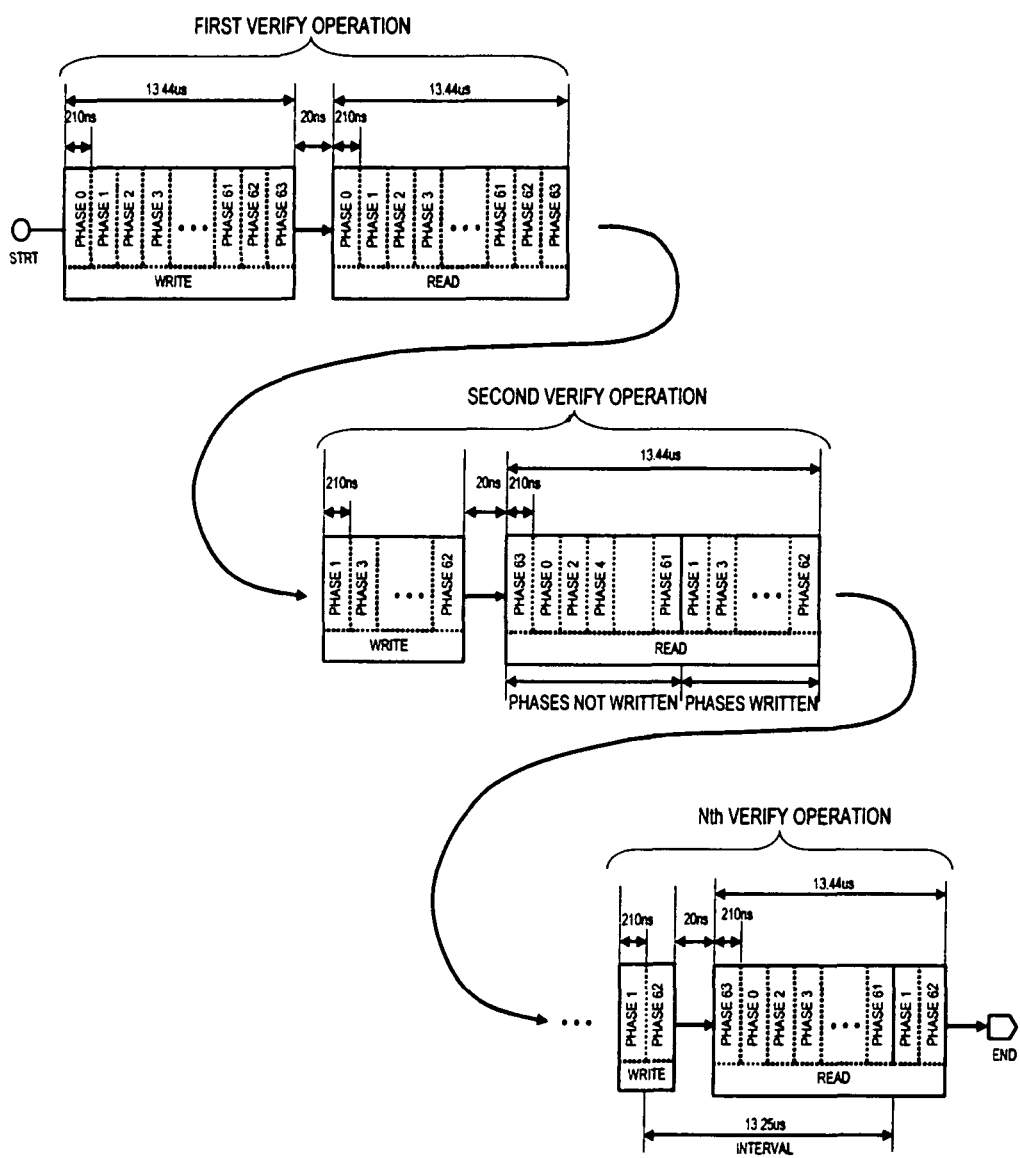
FIG. 7 is a diagram explaining a write sequence in a second exemplary embodiment of the present invention.

In the second example, a method of controlling the reading order of phases is elaborated. The number of phases for rewriting is thereby reduced, and throughput of writing operation is improved without reducing an interval on the basis of a rewritten cell, as compared with the first example. FIG. 7 is a schematic diagram explaining verify operations in the second example.

In a first verify operation, sequential writing is performed to all the phases, and then verify reading is performed, as in the first example.

In this case, the phase in which presence of a fail bit has been confirmed by the reading is regarded as a fail phase, and fail information is saved in the judgment register 105, in association with the phase.

In a subsequent second verify operation, the information saved in the judgment register 105 as a result of the first verify operation is read. Rewriting is sequentially performed only to the phases (in the ascending order of the phases, for example), which have been determined to be fail in the first verify operation.

Determination as to whether rewriting is performed to the phase is made by taking a logical sum of information (pass=0, fail=1, for example) in the judgment register 105 on cells belonging to the phase. When the logical sum of information on the cells belonging to the phase is 1, the phase is determined to need rewriting. When the logical sum of information on the cells belonging to the phase is 0, the phase is determined not to need rewriting (or need write masking). In this case, a wait time is not provided for the phase which has passed the immediately preceding verify operation (first verify operation). That is, in the second example, waiting for a time of 210 ns is not performed for the phase of which writing is masked (so that the corresponding time is eliminated, or a sub-routine is skipped). Then, writing is performed to the next phase which needs writing.

In the read sequence of the second verify operation, reading is started from the phase subsequent to the phase which has been written last in the write sequence of the second verify operation, and reading of only the phases (phases targeted for write masking) which have not been written in the second verify operation is started sequentially (in the ascending order, for example), referring to the information in the judgment register 105.

As mentioned above, in the read sequence of the second verify operation, by starting reading from the phase (phase 63 in FIG. 7) subsequent to the phase (phase 62 in FIG. 7) which has been written last in the write sequence of the second verify operation, it is not necessary to forcibly reset a count value of the phase counter 120 (refer to FIG. 1) at a start of the read sequence.

After reading from phase 63 has been performed in the read sequence of the second verify operation, the operation is returned to phase 0 of the smallest number which has not been written in the write sequence of the second verify operation, and then reading is performed in the ascending order of phase 2, 4, . . . 61. When the count value of the phase counter 120 reaches 63 (corresponding to phase 63), the phase counter 120 next starts counting up from 0. Determination as to whether or not the pertinent phase in the read sequence of the second verify operation is the phase which has not been written in the write sequence of the second verify operation is made, based on the cell information associated with the phase, held in the judgment register 105 (writing to the phase which has passed the first verify operation is masked).

The phases which have not been written in the write sequence of the second verify operation (such as phases 0, 2, 4, . . . 61, 63 in the example of FIG. 7) are the phases which have all passed the first verify operation. However, these phases are read again in the read sequence of the second verify operation, as in the first example. With this arrangement, it is possible to check write data in the cells in the phases again. However, it is not always necessary to recheck these resistance values, and reading from the cells and the phases that have passed the first verify operation may be masked in order to reduce power consumption at a time of reading, as in the first example. Read times of the phases of which reading has been masked are not eliminated, and waiting of the read times is performed.

When completing reading from the phases which have not been written, the phases (phases 1, 3, . . . , 62 in FIG. 7) which have been written in the write sequence of the second verify operation are next read sequentially (in the ascending order of the phases), with reference to the judgment register 105.

By rearranging the order of reading as described above in the second example, the interval of 13.25 µs (=13.44 µs−210 ns+20 ns) can be constantly provided from completion of writing to start of reading, as shown in FIG. 7.

This verify operation is repeated until all the phases pass the verify operation.

With this arrangement, an adequate interval can be provided from completion of writing to start of reading, as in the first example, while eliminating the wait time for the phase of which writing has been masked, unlike the first example. More specifically, in the first example, waiting of 210 ns is performed in each phase of which writing is masked during writing of the verify operation. In this example, the write time in the verify operation is set to "number of phases of which writing is necessary"×210 ns, and a wait time, corresponding to 210 ns×"number of phases of which writing is masked", is compressed (eliminated). Even with this arrangement, a switching time of 20 ns between reading and writing and a read time of 13.44 µs in this example are set to be the same as in the first example.

As shown in FIG. 7, the time interval of (13.44 µs−210 ns)+20 ns=13.25 µs is provided between a writing completion time and a reading start time of phase 0 in the first verify operation. The same holds true for the other phases.

The time interval of 13.25 µs is provided between a rewriting completion time and a reading start time of phase 1 in the second verify operation as well. When the number of the phases which have been rewritten based on the write sequence of the first verify operation in FIG. 7 is set to n (1≦n≦64), the number of the phases which have not been written and from which reading will be performed before phase 1 in the read sequence of the second verify operation is 64−n. Accordingly, a time interval between a rewriting completion time and a reading start time of phase 1 in the second verify operation is as follows:

$$(n-1) \times 210 \text{ ns} + 20 \text{ ns} + (64-n) \times 210 \text{ ns} = (64-1) \times 210 \text{ ns} + 20 \text{ ns}$$
$$= (13.44 \text{ }\mu\text{s} - 210 \text{ ns}) + 20 \text{ ns}$$
$$= 13.25 \text{ }\mu\text{s}$$

Similarly, a time interval between a rewriting completion time and a reading start time of each of the other phases is also 13.25 μs.

When verifying operations have been performed N times (prescribed number of times) and all the cells in the same phase have not passed, status information indicating a failure of writing may be output to an outside from the I/O ports I/O1 to I/O8 through the control logic 113 and the status register 115.

As an application (though not shown), the above defined operation on each phase may be further time-divided to be performed at a time of writing alone in order to reduce current at the time of the writing. When each phase at the time of writing is divided into two (when the number of simultaneous writes in each phase is halved and writing operations are performed twice), for example, a write sequence period doubles, but peak current at the time of writing is halved. Further, the number of the write amplifiers can be halved by refining a bit line control circuit. Similarly, only the operation on each phase in a read sequence may be further time-divided.

Third Example

Figure 8:
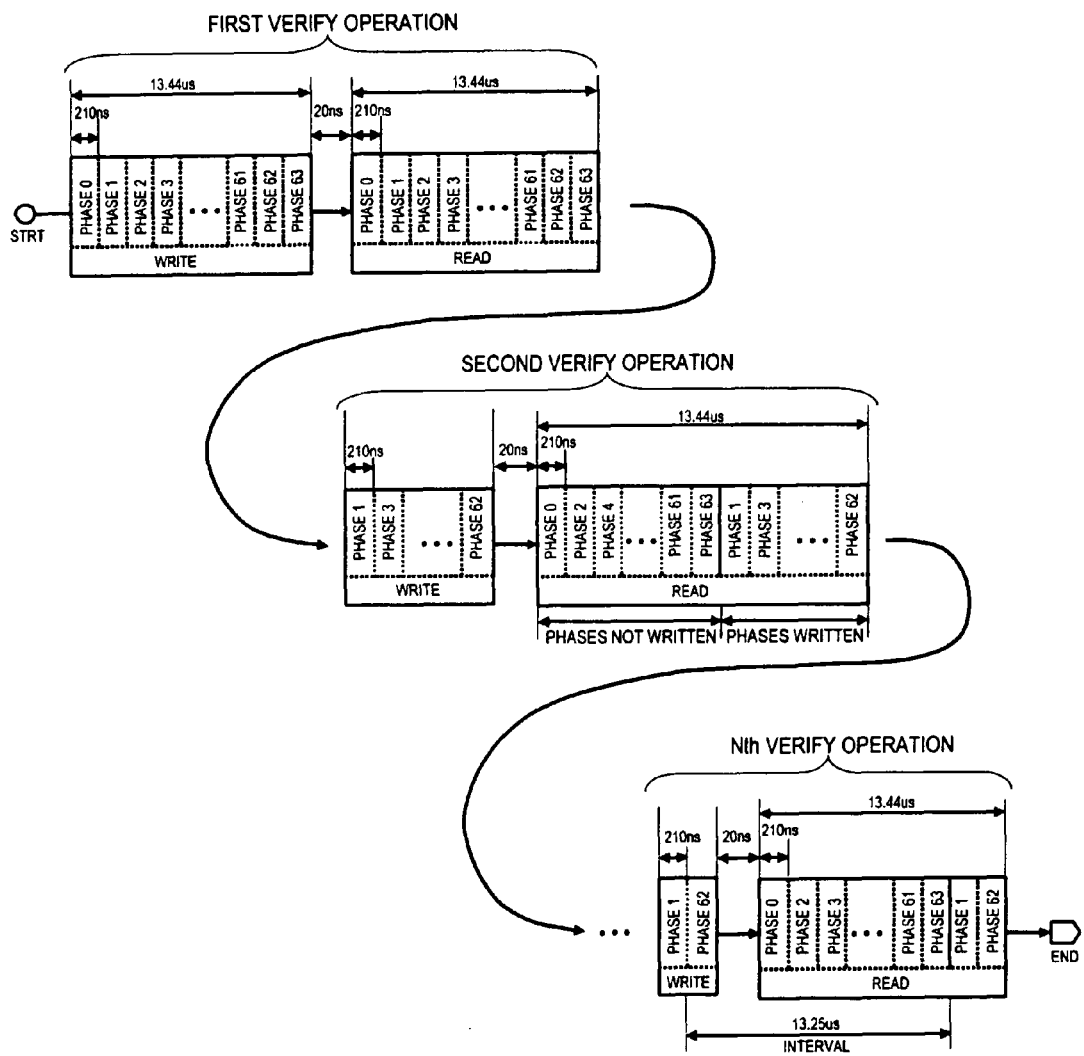
FIG. 8 is a diagram explaining a write sequence in a third exemplary embodiment of the present invention.

In the second example, in the read sequence of the second verify operation or thereafter, reading is started from the phase subsequent to the phase which has been rewritten last in the write sequence. In a third example, a method different from the method in the second example will be provided. FIG. 8 is a diagram explaining the third example.

As shown in FIG. 8, phases which have not been written in a write sequence in a verify operation may be read in the ascending order of phase addresses, for example. In the example shown in FIG. 8, in a read operation after a phase written last (phase 62 in FIG. 8) in a second verify operation and an Nth verify operation, sequential reading is performed, starting from phase 0 rather than the phase (phase 63 subsequent to phase 62) subsequent to the phase written last. Accordingly, a count value of the phase counter 120 in FIG. 1 is forcibly reset to 0, from the current value of 62. In other words, the verify operation is sequentially executed, starting from the initialized address (predetermined address) for the phase counter 120.

In this third example as well, an interval of 13.25 μs (=13.44 μs−210 ns+20 ns) can be provided from completion of writing to start of reading, as in the second example. This operation is repeated until all phases pass the verify operation. When the verify operations have been performed N times (prescribed number of times) and all cells in the same phase have not passed, status information indicating a failure of writing may be output to an outside from the I/O ports I/O1 to I/O8 through the control logic 113 and the status register 115.

According to the above-mentioned examples, an interval from completion of writing to start of verify reading can be ensured without causing a great reduction of write throughput while ensuring a time taken for cell resistances to reach the steady-state resistance values from the transient resistance values in the transient state.

The technical concepts according to the present invention can be applied to various semiconductor devices. The present invention can be applied to control methods of nonvolatile semiconductor devices such as a CPU (Central Processing Unit), an MCU (Micro Control Unit), a DSP (Digital Signal Processor), an ASIC (Application Specific Integrated Circuit), an ASSP (Application Specific Standard Product), and a memory each including phase change memory elements. As types of products of such semiconductor devices to which the present invention has been applied, an SOC (System On Chip), an MCP (Multi-Chip Package), a POP (Package On Package), for example, can be pointed out. The present invention can be applied to the non-volatile semiconductor devices having these arbitrary types of products and types of packages.

Each disclosure of Patent Documents and Non-patent Document described above is incorporated herein by reference. Modifications and adjustments of the exemplary embodiment are possible within the scope of the overall disclosure (including claims) of the present invention, and based on the basic technical concept of the invention. Various combinations and selections of various disclosed elements are possible within the scope of the claims of the present invention. That is, the present invention of course includes various variations and modifications that could be made by those skilled in the art according to the overall disclosure including the claims and the technical concept.

What is claimed is:

1. A method comprising:
   temporarily storing write-data that are to be written into a plurality of non-volatile memory cells, respectively, the non-volatile memory cells being divided into a plurality of cell groups each comprising at least one non-volatile memory cell;
   performing a first operation, the first operation comprising a plurality of first write-phases that are carried out in series, each of the first write-phases being carried out on an associated one of the cell groups and comprising,
      applying a first write-voltage to the nonvolatile memory cell or cells belonging to the associated one of the cell groups in response to associated one or ones of the write-data that are to be written into the nonvolatile memory cell or cells belonging to the associated one of the cell groups; and
   performing a second operation after the first operation is completed, the second operation comprising a plurality of first read-phases that are carried out in series, each of the first read-phases being carried out on an associated one of the cell groups and comprising:
      applying a first read-voltage to the nonvolatile memory cell or cells belonging to the associated one of the cell groups to produce first read-data therefrom; and
      comparing the first read-data with the associated one or ones of the write-data that are to be written into the nonvolatile memory cell or cells belonging to the associated one of the cell groups to produce first comparison result data.

2. The method as claimed in claim 1, wherein the second operation further comprises:
   temporarily storing the first comparison result data obtained by each of the first read-phases to produce verify data, the verify data including a plurality of bit data, each of the bit data accompanying an associated one of the nonvolatile memory cells and taking a first state when associated ones of the read-data and the write-data are coincident with each other and a second state when the associated ones of the read-data and the write-data are incoincident with each other.

3. The method as claimed in claim 2, wherein the first operation and the second operation serve as a first verifying operation, and wherein the method further comprises a second verifying operation when at least one of the bit data of the verify data takes the second state, the second verifying operation comprising:

performing a third operation, the third operation comprising at least one second write-phase, the second write-phase being carried out on at least one of the nonvolatile memory cells that is accompanied by the bit data of the verify data that takes the second state and comprising, applying a second write-voltage to the one of the nonvolatile memory cells in response to an associated one the write-data that is to be written into the one of the nonvolatile memory cells; and performing a fourth operation after the third operation is completed, the fourth operation comprising at least one second read-phase, the second read-phase comprising:

applying a second read-voltage to the one of the nonvolatile memory cells to produce second read-data therefrom; and comparing the second read-data with the associated one of the write-data that is to be written into the one of the nonvolatile memory cells to produce second comparison result data.

4. The method as claimed in claim 3, wherein the second write-phase is carried out on one of the cell groups that includes the one of the nonvolatile memory cells while masking the second write-voltage from being applied to remaining nonvolatile memory cell or cells of the one of the cell groups that are accompanied respectively by the bit data of the verify data that takes the first state.

5. The method as claimed in claim 4, wherein the second read-voltage is further applied to the remaining nonvolatile memory cell or cells of the one of the cell groups to produce third read-data therefrom, and the third read-data are compared with the associated ones of the write-data that are to be written respectively into the remaining nonvolatile memory cell or cells.

6. The method as claimed in claim 2, wherein the first operation and the second serve as a first verifying operation, and wherein the method further comprises a second verifying operation when at least one of the bit data of the verify data takes the second state, the second verifying operation comprising:

performing a third operation, the third operation comprising a plurality of second write-phases that are carried out in series, each of the second write-phases being carried out on associated ones of the cell groups containing the nonvolatile memory cell or cells that are accompanied respectively by the bit data of the verify data that takes the second state, each of the second write-phases comprising, applying a second write-voltage to the nonvolatile memory cell or cells belonging to the associated one of the cell groups while masking the second write-voltage from being applied to remaining nonvolatile memory cell or cells belonging to the associated one of the cell groups that are accompanied respectively by the bit data of the verify data that takes the first state; and performing a fourth operation after the third operation is completed, the fourth operation comprising a plurality of second read-phases that are carried out in series, each of the second read-phases being carried out on an associated one of the cell groups and comprising:

applying a second read-voltage to each of the nonvolatile memory cell cells belonging to the associated one of the cell groups to produce second read-data therefrom; and comparing each of the second read-data with the associated one of the write-data that are to be written into the nonvolatile memory cells belonging to the associated one of the cell groups to produce second comparison result data.

7. The method as claimed in claim 6, wherein the third operation further comprises a plurality of wait-phases that are carried out in series, the wait-phases being carried out respectively on remaining ones of the cell groups in which all nonvolatile memory cells are accompanied respectively by the bit data of the verify data that takes the first state, the wait-phase comprising applying no write-voltage being to each of the nonvolatile memory cells contained in the remaining ones of the cell groups.

8. The method as claimed in claim 6, wherein the first and second write-voltages are equal to each other and the first and second read-voltages are equal to each other.

9. The method as claimed in claim 6, wherein an interval between the applying the first write-voltage to and the applying the first read-voltage to the same cell group is equal to or more than a time period required to stabilize a data memorizing state of the nonvolatile memory cell or cells belonging to the same one of the cell groups, and an interval between the applying the second write-voltage to and the applying the second read-voltage to the same nonvolatile memory cell is equal to or more than the time period.

10. The method as claimed in claim 3, wherein the first and second write-voltages are equal to each other and the first and second read-voltages are equal to each other.

11. The method as claimed in claim 1, wherein an interval between the applying the first write-voltage to and the applying the first read-voltage to the same cell group is equal to or more than a time period required to stabilize a data memorizing state of the nonvolatile memory cell or cells belonging to the same one of the cell groups.

12. The method as claimed in claim 11, wherein each of the nonvolatile memory cells comprises a phase change memory cell.

* * * * *